United States Patent
Jacobowitz et al.

(10) Patent No.: US 8,161,314 B2
(45) Date of Patent: Apr. 17, 2012

(54) METHOD AND SYSTEM FOR ANALOG FREQUENCY CLOCKING IN PROCESSOR CORES

(75) Inventors: Lawrence Jacobowitz, Wappingers Falls, NY (US); Mark B. Ritter, Sherman, CT (US); Daniel J. Stigliani, Jr., Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 724 days.

(21) Appl. No.: 11/734,334

(22) Filed: Apr. 12, 2007

(65) Prior Publication Data

US 2008/0256381 A1 Oct. 16, 2008

(51) Int. Cl.
*G06F 1/12* (2006.01)
*G06F 1/00* (2006.01)
*G06F 1/04* (2006.01)

(52) U.S. Cl. .................. 713/600; 713/400; 713/500
(58) Field of Classification Search .................. 713/400, 713/500, 600
See application file for complete search history.

(56) References Cited

U.S. PATENT DOCUMENTS

| | | | |
|---|---|---|---|
| 5,481,573 A * | 1/1996 | Jacobowitz et al. | 375/356 |
| 5,594,895 A | 1/1997 | Raymond et al. | |
| 6,889,331 B2 * | 5/2005 | Soerensen et al. | 713/320 |
| 7,124,315 B2 * | 10/2006 | Espinoza-Ibarra et al. | 713/501 |
| 7,187,742 B1 | 3/2007 | Logue et al. | |
| 7,188,261 B1 * | 3/2007 | Tobias et al. | 713/300 |
| 7,350,096 B2 * | 3/2008 | Boerstler et al. | 713/501 |
| 7,478,259 B2 * | 1/2009 | Ferraiolo et al. | 713/501 |
| 2001/0029590 A1 * | 10/2001 | Sager et al. | 713/501 |
| 2002/0169990 A1 | 11/2002 | Sherburne, Jr. | |
| 2002/0184546 A1 | 12/2002 | Sherburne, Jr | |
| 2003/0014682 A1 | 1/2003 | Schmidt | |
| 2003/0120963 A1 | 6/2003 | Jahnke | |
| 2004/0139362 A1 * | 7/2004 | Inaba | 713/322 |
| 2004/0251970 A1 | 12/2004 | Fayneh et al. | |
| 2005/0166073 A1 | 7/2005 | Lee | |
| 2007/0064852 A1 * | 3/2007 | Jones et al. | 375/356 |

(Continued)

FOREIGN PATENT DOCUMENTS

WO WO2006000929 A3 1/2006

OTHER PUBLICATIONS

Anonymous, "Bios and Kernel Developer's Guide for the AMD Athlon™ 64 and AMD Opteron™ Processors" AMD Athlon 64 Processor Tech. Docs. Page on Internet, Feb. 2006, pp. 261-294.

(Continued)

*Primary Examiner* — Ji H Bae
(74) *Attorney, Agent, or Firm* — Scully, Scott, Murphy & Presser, P.C.; Anne V. Dougherty, Esq.

(57) ABSTRACT

A method of and system for frequency clocking in a processor core are disclosed. In this system, at least one processor core is provided, and that at least one processor core has a clocking subsystem for generating an analog output clock signal at a variable frequency. Digital frequency control data and an analog signal are both transmitted to that at least one processor core; and that processor core uses the received analog signal and digital frequency control data to set the frequency of the output clock signal of the clocking subsystem. In a preferred implementation, multiple cores are asynchronously clocked and the core frequencies are independently set.

20 Claims, 5 Drawing Sheets

U.S. PATENT DOCUMENTS

2007/0266268 A1    11/2007    Abbo et al.

OTHER PUBLICATIONS

Anonymous, "Enhanced Intel® SpeedStep® Technology for the Intel® Pentium® M Processor—White Paper", Mar. 2004, p. 6.

Feng, W., et al., "Green Destiny and Its Evolving Parts", Jun. 2004, Heidelberg, Germany.

Li, J., et al., "Dynamic Power-Performance Adaptation of Parallel Computation on Chip Multiprocessors", High-Performance Computer Architecture, The Twelfth International Symposium, Feb. 11, 2006, pp. 77-87, Piscataway, NJ.

Muralimanohar, N., et al., "Power Efficient Resource Scaling in Partitioned Architectures through Dynamic Heterogeneity", Performance Analysis of Systems and Software, IEEE International Symposium, Mar. 19, 2006, pp. 100-111, Piscataway, NJ.

Official Action dated Oct. 12, 2010 received from the Chinese Patent Office in connection with counterpart Chinese Patent Application No. CN 200880011570.3.

* cited by examiner

METHOD AND SYSTEM FOR ANALOG FREQUENCY CLOCKING IN PROCESSOR CORES

CROSS REFERENCE TO RELATED APPLICATION

This application is related to copending application Ser. No. 11/734,375, for "Method and system for Digital frequency Clocking in Processor cores," filed herewith, the disclosure of which is herein incorporated by reference in its entirety.

BACKGROUND OF THE INVENTION

1. Field of the Invention

This invention generally relates to data processing systems, and more specifically, to frequency clocking in processor cores. Even more specifically, in the preferred embodiment, the invention relates to the analog multi-frequency clocking in multi-chip/multi-core processors.

2. Background Art

Servers are beginning to exploit a multiplicity of multi-core processor chips in order to continue to increase performance as processor frequency scaling can no longer meet the industry growth in performance. Also, the increasing difficulty and hardware cost, as well as signal integrity concerns, associated with the transmission of high frequency clocking throughout a multi-chip and multi-core processor server make this an untenable long-term strategy for future server systems. The state of the art for clock distribution is based on high-speed analog signals using transmission lines. This technique is limited in scalability due to skin effect, media and connector loss, crosstalk, termination mismatches, etc. Today's large servers contain, for example, greater than 10 processor chips typically containing two cores. It is expected that both chips and cores per chip will increase in the future. Transmission of high frequency clocks (>5-10 GHz) for multiple chips comprised of multiple cores is not feasible with known board technology and connectors. The need to operate this configuration in a tightly coupled mode, such as a Symmetric Multi-processor (SMP), will require a new clocking paradigm.

As microprocessor chips become larger with more cores, regional process and parameter variability across chip means that each core will have an optimal power/performance metric at a different chip voltage and clock frequency setting. Obtaining optimum performance for each core within a multi-core system is not feasible today. Separate core voltage domains are known and state-of-the-art but they can only serve to optimize the power at the chip level and not obtain optimum core performance. A server system with separate frequency domains per core is very complicated and is not practiced in the industry. For example, multiple off-chip and on-chip oscillators are required. Spread spectrum clocking used for EMI reduction with multiple oscillators makes "synchronous spreading" very difficult or impossible. Prior art technology is based on distribution of clocking signals across a wiring network known as a clock-tree. With the growth in the number of cores in multi-core microprocessors, clock-trees also grow into enormous complexity, creating serious chip layout design difficulties and translating into detractors to final product yield and related increase in manufacturing cost.

SUMMARY OF THE INVENTION

An object of this invention is to provide a method of and system for processor clocking in multiple multi-core processor chip servers and computing platforms.

Another object of the present invention is to enable optimum frequency performance of each of multiple processor cores independently of the other processor cores.

A further object of the invention is to achieve clock distribution to each core of a multi-core processor chip via a combination of a multi-cascade analog tree distribution network and a digital data distribution network.

These and other objectives are attained with a method of and system for frequency clocking in a processor core. At least one processor core is provided, and that at least one processor core has a clocking subsystem for generating an analog output clock signal at a variable frequency. Digital frequency control data and an analog signal are both transmitted to that at least one processor core; and that processor core uses the received analog signal and digital frequency control data to set the frequency of the output clock signal of the clocking subsystem. In a preferred implementation, multiple cores are asynchronously clocked and the core frequencies are independently set.

Also, in a preferred embodiment, a plurality of processor cores are provided, and each of the processor cores has a respective clocking subsystem for generating an analog output clock signal at a variable frequency. In this preferred embodiment, an analog signal and individual digital frequency control data are transmitted to each processor core; and each processor core receives the analog signal and digital frequency control data transmitted to the core, and uses the received analog signal and digital control data to set locally (on the core) the frequency of the output clock signal of the clocking subsystem of the processor core.

The preferred embodiment of the invention provides a computing system (Server) clocking subsystem solution with a single system reference oscillator, which may be spread (for spread-spectrum) to satisfy EMI requirements. The invention achieves clock distribution to each core via a classical multi-cascade analog tree distribution network and a digital data distribution network to each core. Each core takes both inputs to generate a precise frequency clock for the core, which may be unique to that core. The local core clock synthesizer frequency is determined by the digital control data which is used in conjunction with the analog core clock input to set the precise core frequency of operation using digital signal processing or other digital means. The frequency can be established based upon a policy set by the server manufacturer or customer. For example, the frequency can be set to the maximum capability of each core based upon a particular voltage of operation for all cores.

The frequency control information is sent to each core as moderate speed (10-100 Mb/s) digital data words thereby avoiding the problems with high-speed analog signal transmission. The frequency control information has high noise immunity and low signal distortion since it is in the form of digital data. The frequency control information is sent as individual control data words (v data) to each core. The data is latched into the core "clock synthesizer memory" from the server SEEPROM, which contains the vital chip data (VCD) for each core in the server. The single system reference oscillator is set at a moderate frequency (10-100 MHz), which is distributed to each core via analog transmission line techniques; phase locked loops (PLL), and re-drive circuits. The analog clock signal frequencies are kept moderate prior to the individual core clock synthesizers to avoid high-speed distortion effects.

The system reference clock, chip clock, and generic core clock signals are continuously required to maintain a stable core clock. However, the fundamental core operating frequency changes infrequently (except for certain spread spectrum techniques) such that speed v data changes are infrequent and only periodic v data updates are sufficient to generate a clock for each core.

Each core is running asynchronous from each of the other cores and with respect to local cache. It will be appreciated that, once the different regions of a chip are asynchronous, some handshaking/buffering will be required to transfer data between regions, so there will be some added latency. Techniques are known to minimize this latency. Nevertheless, the net performance gain of operating each core at its maximum frequency will be substantial (10-20%).

The present invention can be applied to any processing platform that uses multi-microprocessor core silicon chips. For example, client uP platforms, storage controllers, data communication switches, etc.

Further benefits and advantages of this invention will become apparent from a consideration of the following detailed description, given with reference to the accompanying drawings, which specify and show preferred embodiments of the invention.

DETAILED DESCRIPTION OF THE PREFERRED EMBODIMENTS

Figure 1:
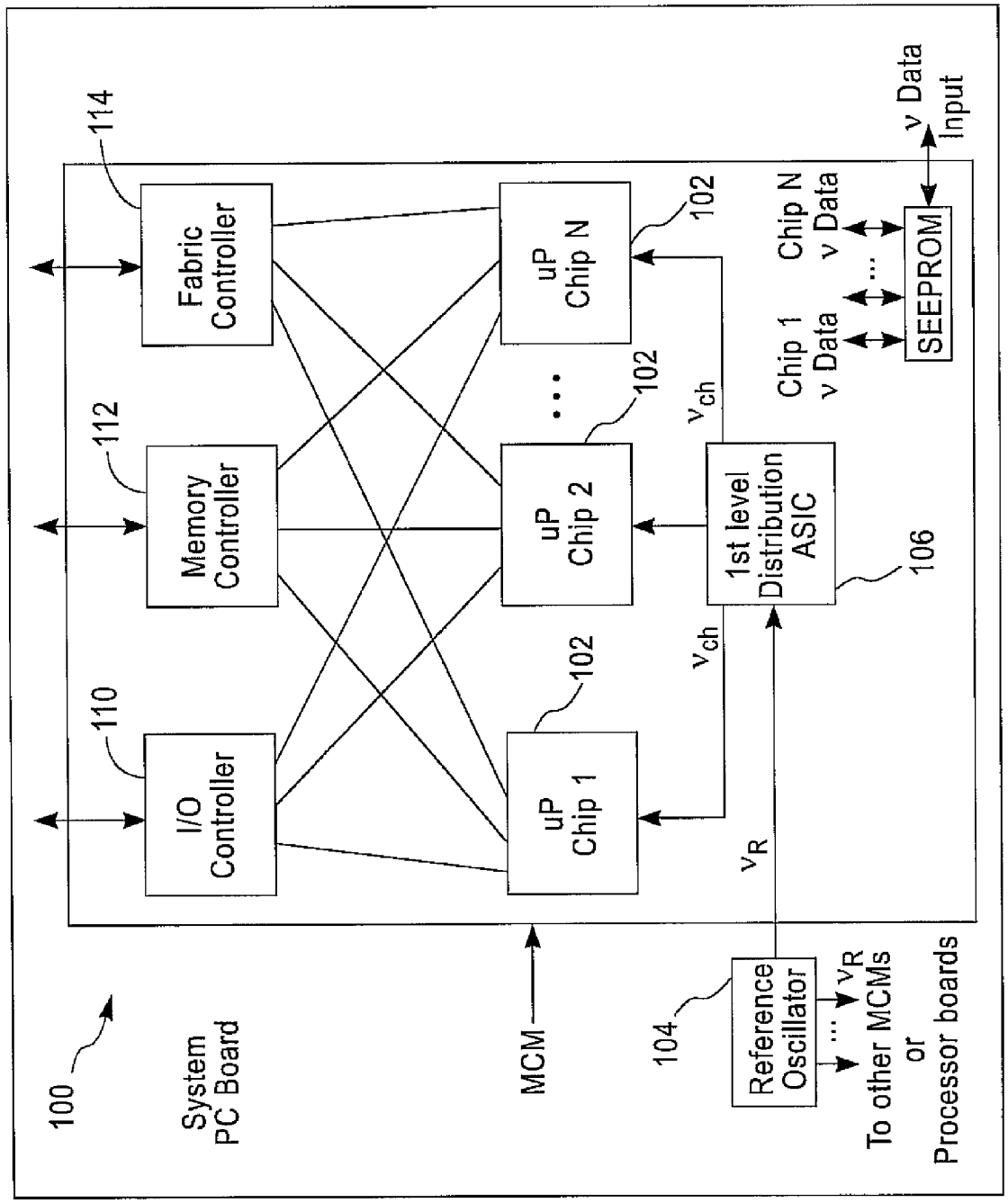
FIG. 1 shows an analog multi-frequency clocking of a processor subsystem.

FIG. 1 illustrates a typical computing Server 100 that is composed of multiple microprocessor (uP) chips (N) 102 which has internal clocking functions (e.g. digital signal processor, DSP, core clock generator, etc.) that utilize the server reference oscillator (vR) as the basic system clock. A Master PLL and distribution ASIC (Application Specific Integrated Circuit) on the MCM or system board multiplies, re-drives, and distributes the reference clock signal to each uP chip in the Multi-chip Module (MCM) or system board. The output of the Master PLL & Distribution ASIC is a chip clock signal (vch) that is distributed throughout the processor chip.

The reference oscillator 104 clock frequency (vR) is a relatively low frequency (typically 10-100 MHz) such that it can be easily routed throughout the PC board without significant signal degradation yet fast enough to enable feasible up-conversions rates to insure the uP high speed clock (typically 5-10 GHz) is stable and remains within the platform deviation requirement (typically 10-100 ppm, parts per million). The distribution network is generally point-to-point (illustrated in FIG. 1) for best reference clock integrity with signal re-drive at the up-conversion points. The first up-conversion and re-drive point is the Master PLL 106 which is used to generate the chip frequency (vch) clock for each microprocessor chip in the server. The Master PLL not only re-drives the signal but also multiplies the reference oscillator by typically 2-10x. The uP chip clock signal is, in turn, distributed within a chip by a second level distribution ASIC for use by each core clock synthesizer to generate the fundamental core clock, described below.

FIG. 1 also shows the interconnection from the uP chips to the I/O Subsystem, System Memory, and external System Clustering fabric via the appropriate controller interface 110, 112 and 114. The Clustering fabric is used to interconnect multiple MCMs together to construct a larger multi-processor Server where the MCMs are connected in a symmetric multi-processing (SMP) configuration. In an SMP configuration, the memory is coherent to all the processors within the SMP. In this case, all the MCMs are synchronized to a single Reference Oscillator 104 (illustrated in FIG. 1 outside the MCM).

The preferred method of this invention can also be used on a configuration of uP chips contained on multiple Single Chip Modules (SCM) mounted on a common glass epoxy printed circuit (PC) board. This alternate packaging configuration may be used for smaller systems. In this case, the Distribution ASIC is also mounted in an SCM on the system board and interconnection to each processor chip is done via system PC board wiring.

The MCM and/or PC board contains vital core frequency data (VCD) for each core in the server. This information is typically maintained in a Serial Electrically Erasable Programmable Read Only Memory (SEEPROM). This SEEPROM contains the vital core frequency data (v data) for each connected processor (core). The "v data" is the digital representation of the optimum processor (core) frequency along with identification (Id) of the appropriate chip and core. The Id information is used to insure the correct VCD is transmitted and stored in the VCD Interface function on each chip, for all cores on the chip. The VCD is derived from the frequency characterization data, voltage characterization data, power characterization, etc. gathered by the Service Element (SE).

The SE analyzes and reformats the data and loads the data into the system SEEPROM via an appropriate digital interface (e.g. I2C). The totality of data gathered and analyzed by the SE is used to set the optimum frequency, voltage, etc. for each core to achieve the highest performance possible or other policy established by the customer. A novel aspect of this invention is the use of data to generate the optimum processor frequency locally (within core) in conjunction with the up-converted reference clock versus today's approach of transmitting the same analog clock signal to all cores.

The data for each core/chip can be obtained during the chip test/verification stage in the manufacturing process or as part of a training paradigm during power-on sequence of the server. The latter approach would be part of the initialization and set-up process of the server.

Figure 2:
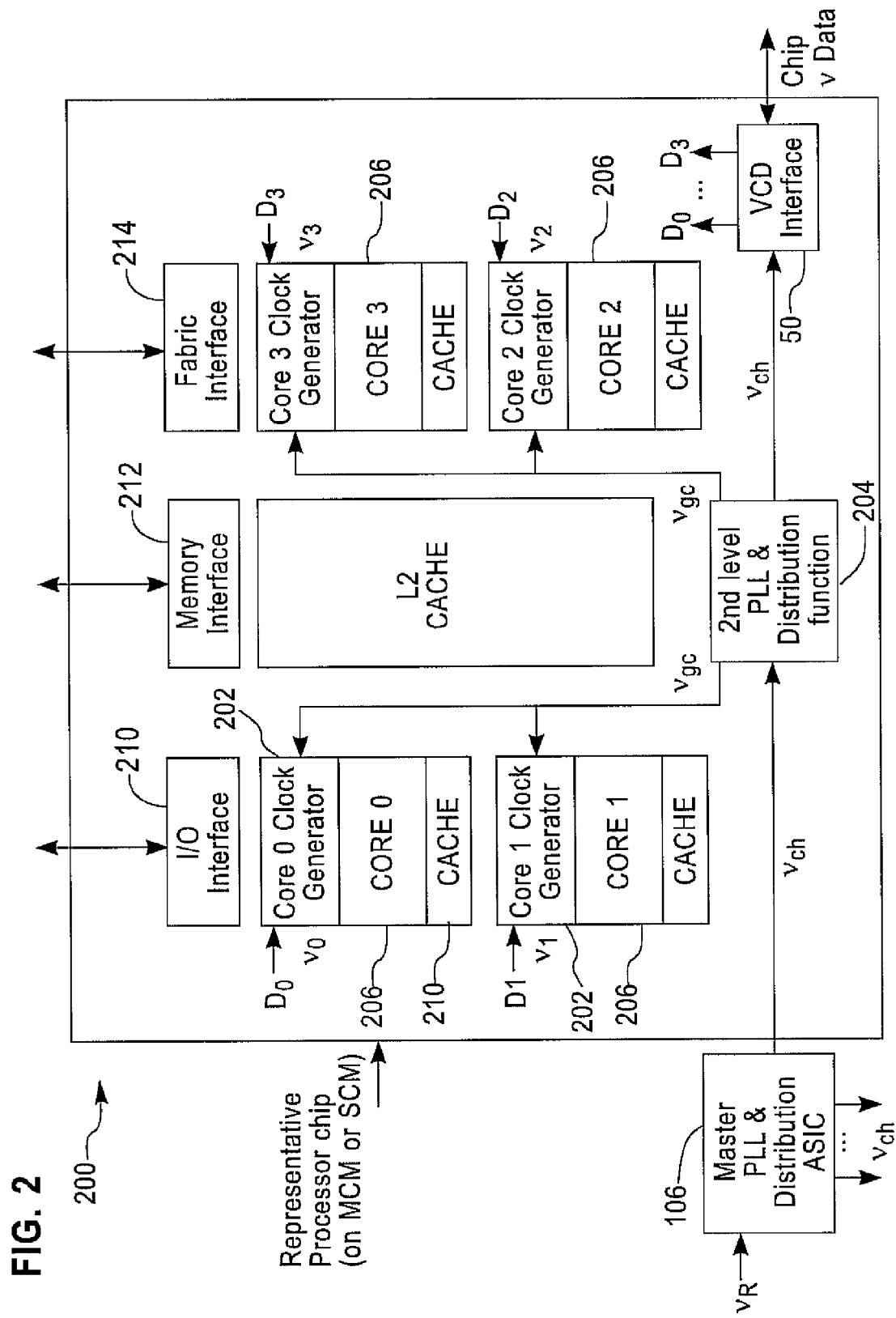
FIG. 2 illustrates an analog multi-frequency clocking of processor chips.

A representative server processor chip (one of several for a typical server) configuration with multi-cores (4) and shared L2 cache is illustrated at 200 in FIG. 2. The four core clock synthesizers 202 within the processor chip receive the generic core clock (vgc) from the second level PLL and distribution ASIC 204 by means of the second level distribution network, which is contained on the chip. The generic core clock signal (vgc) is transmitted to each core using a multi-drop bus (illustrated) or a point-to-point star interconnection. The second level distribution ASIC 204 provides the necessary frequency up-conversion to generate the generic core clock (typically 10-20x), re-drive circuits, and a clock (vch) for the VCD Interface, function.

The VCD Interface function contains the VCD interface to the SEEPROM (See FIG. 1) to receive and store the appropriate data for setting the precise frequency of each of the cores within the chip along with the appropriate Ids. The VCD Interface function interrogates the SEEPROM and obtains the appropriate data (typically through an I2C interface) for its' cores. It may contain some SRAM and state machines or small controller in addition to the I2C interface to perform this function. The VCD Interface function also performs the distribution function by transmitting the ν Data to the appropriate core synthesizer only.

As part of the ν data content, a unique chip and core Id is included which is related to the chip and module serial number. This core Id is used by the VCD Interface function to route the ν data to the appropriate port. For example, ν Data intended for core "0" is routed to port "D0" (FIG. 2). The ν data is stored in the clock synthesizer and is used as the processor clock frequency data until it is updated by the VCD function on chip. If no changes are forthcoming, no data is sent from the VCD Interface function or the SEEPROM. The ν data is not sent continuously, but only when it is updated. This is in contrast to the state-of-the-art analog technique where the signal must be sent continuously. However, the analog clock is sent continuously to ensure a stable core clock.

Each core 206 is comprised of the microprocessor, dedicated cache 210, and the core clock synthesizer 202. The core frequency is set by the core clock synthesizer and the digital ν data in the VCD for each core. Each core is likely to have different frequency settings. The number of cores within the processor chip is determined by the technology and manufacturing process capability. Four are shown in FIG. 2 for illustrative purposes. The technical approach described herein easily scales with the number of cores, which will likely increase in the future. The chip 200 also contains the appropriate interfaces 210, 212, 214 to the I/O, Memory, and Fabric controllers.

Figure 3:
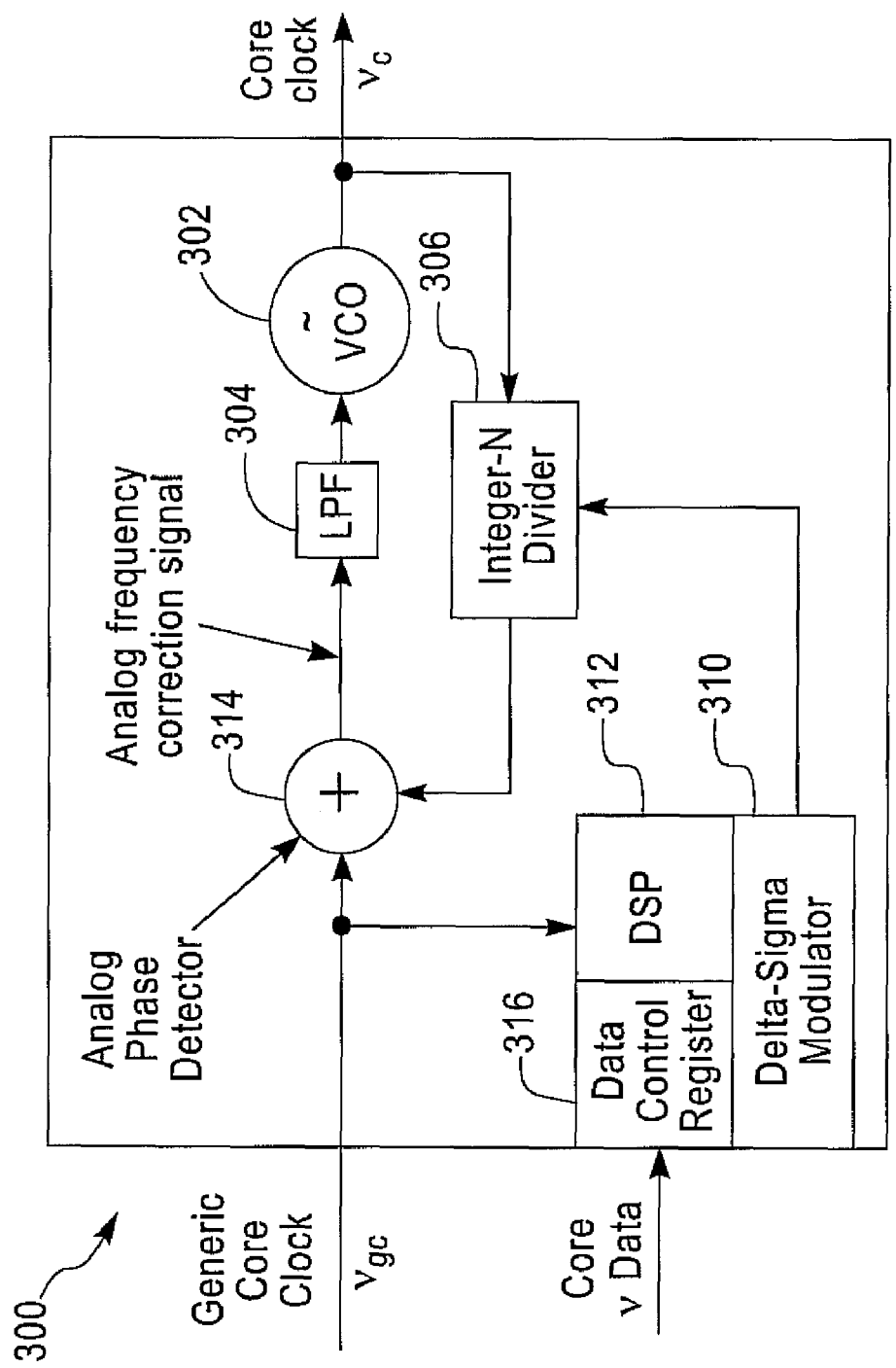
FIG. 3 shows a local core clock synthesizer embodying the present invention.

The design of the core clock synthesizer is illustrated at 300 in FIG. 3. It is comprised of a voltage controlled high speed oscillator (VCO) 302, a low pass filter (LPF) 304, a digitally controlled integer-N divider 306, and a Delta-Sigma modulator 310 in conjunction with a digital signal processor (DSP) 312. This arrangement is a variation of the known Delta-Sigma fractional-N synthesizer, which is used to tune each core clock to operate above and below the generic core clock operating frequency of the server. The VCO operating range, center frequency, and voltage to frequency conversion characteristic is a function of the VCO design and technology. The VCO is tuned to a precise fractional frequency by changing the analog control voltage up or down in precise increments to achieve the desired frequency.

A portion of the core clock output of the VCO is sent to the integer-N divider, which divides the incoming core clock frequency by an integer N value from the Delta-Sigma modulator. The Delta-Sigma modulator provides an output bit stream of time discrete integer values such that the average of the division ratio is equal to the input desired fractional division ratio. The desired fractional division ratio is generated by the DSP. The DSP 312 converts the desired ν data digital frequency value to the appropriate fractional division ratio to yield the desired optimum core frequency. The reference frequency may be set at the factory based on the desired generic core frequency, which is the basis for determining the desired fractional division ratio.

The divided output signal of the Integer-N divider 302 is phase compared to the generic core frequency "vgc" in the analog phase detector 314. If the two signals are matched, no frequency correction signal is generated and the clock synthesizer core output is equal to the desired core frequency, which is defined by the core ν data input to the DSP. If there is a mismatch, a correction signal voltage is generated, which is passed through a low pass filter (LPF) 304 to remove high frequency noise prior to being applied to the voltage-controlled oscillator (VCO) 302. The error signal directs the VCO to alter its' output frequency in the direction to drive the correction signal to zero and achieve a frequency match at the phase detector.

Since each core is likely to be at a different frequency, any issues associated with electromagnetic interference (EMI) are likely to be mitigated and the need for spread spectrum techniques minimized. Nevertheless, this approach offers a novel spread spectrum technique, which is not available with today's technology to reduce EMI even further. For example, the DSP could systematically add and subtract a predefined amount from the ν data value in the Data Control Register 316. This is done in a way such that the mean value always remains the same as the base ν data value. Each core clock frequency (VCO output) will oscillate about the mean frequency value based upon a spread spectrum oscillating frequency, which is independently chosen for each core. This approach allows the spread spectrum approach to be asynchronous for each core, thereby lowering the total EMI. An alternative is to have the spread spectrum oscillating frequency the same for each core. Inherent to the Delta-Sigma modulator is a harmonic dither driver, thereby eliminating the need to add an external dither modulator to effect the spread-spectrum EMI mitigation.

Another approach is to vary the reference oscillator about its' mean. This variation will change the frequency base for comparison in the phase detector, causing the VCO core frequency to change.

Figure 4:
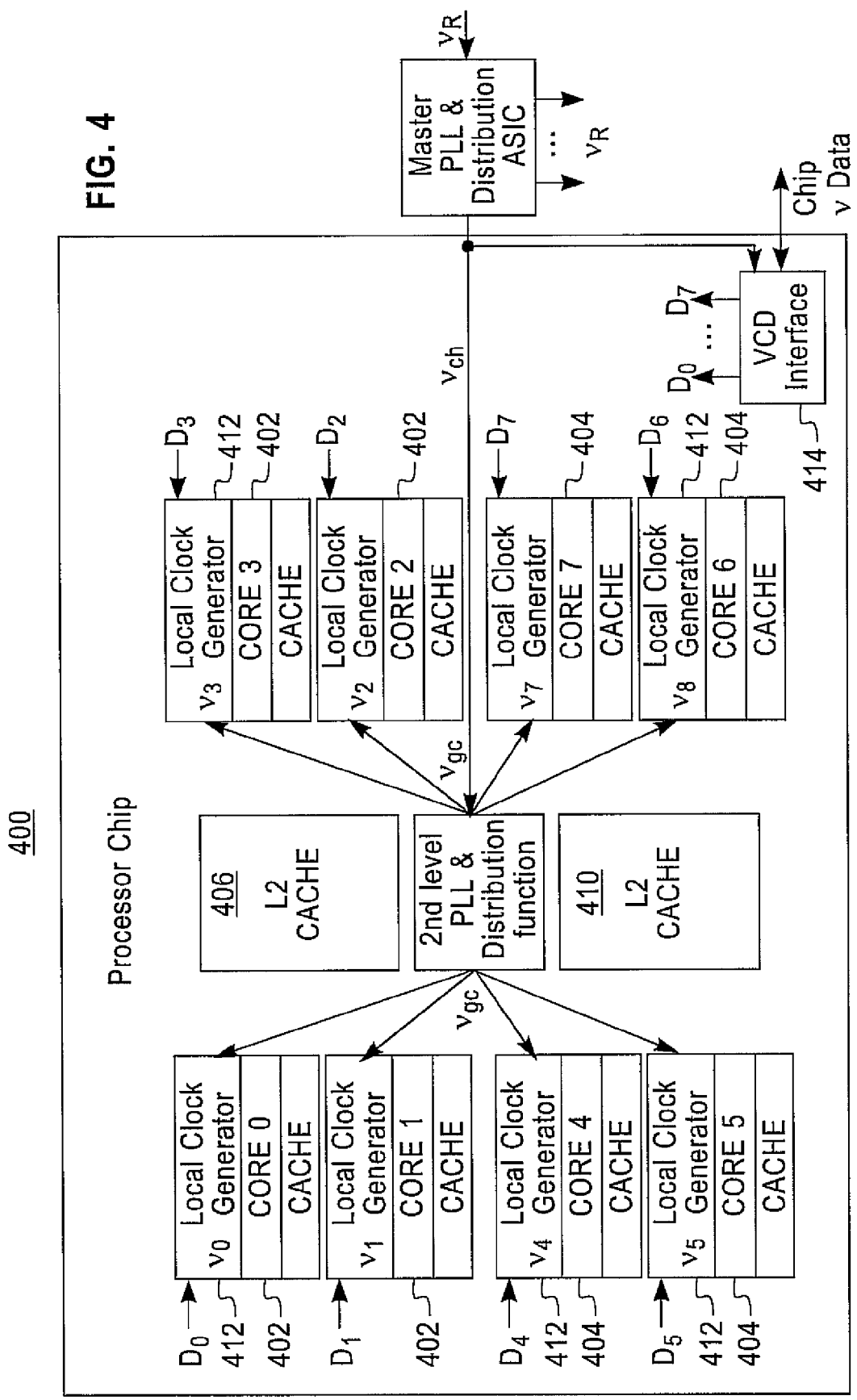
FIG. 4 shows an alternate processor configuration in which multi-core groups share an L2 cache.

FIG. 4 illustrates at 400 an alternate processor chip configuration (versus FIG. 2) where multi-core groups 402, 404 share an L2 cache 406, 410. The chip 400 also contains the appropriate interfaces to the I/O, Memory, and Fabric controllers (not shown). The generic core clock signal (vgc) is star connected to each core clock synthesizer 412. The chip clock (vch) is shown as direct connected to the VCD Interface function 414 from the Master PLL & Distribution ASIC but may include a re-drive circuit at the junction point. The digital clocking attributes and functions discussed for FIG. 2 also apply to this configuration. The configuration in FIG. 4 could have common L2 cache clocking frequency or separate frequencies, depending on regional variability in cache. This arrangement is optimal for wiring resource: local processor/L1 cache clock grids, and Vdd (power supply voltage) grids.

As shown in FIG. 3, the output signal from the VCO to each core, or, to any grouping or subset of cores on the multicore processor chip, provides a natural interconnected organization which enables a locally addressable switch or 'gate control' to selectively shut-off any pathway to said core or grouping of cores. In effect, the switching off of the local core clock(s) enables fine-grained power management without inducing power-fluctuations in the power-grid supply voltage, since the present invention teaches a method of clock frequency control not based on the use of varying the power supply or power grid voltages, nor, of varying Vdd. In this manner, workload monitors via autonomic sensor circuits, can turn off idle cores, or, redistribute workloads to optimize performance at a minimum physically possible power point. The present invention recognizes and specifically points out the significant distinguishable advantages of eliminating noise effects associated with voltage (or power) grid variations or voltage-island designs used in prior art approaches for clock frequency variation.

Figure 5:
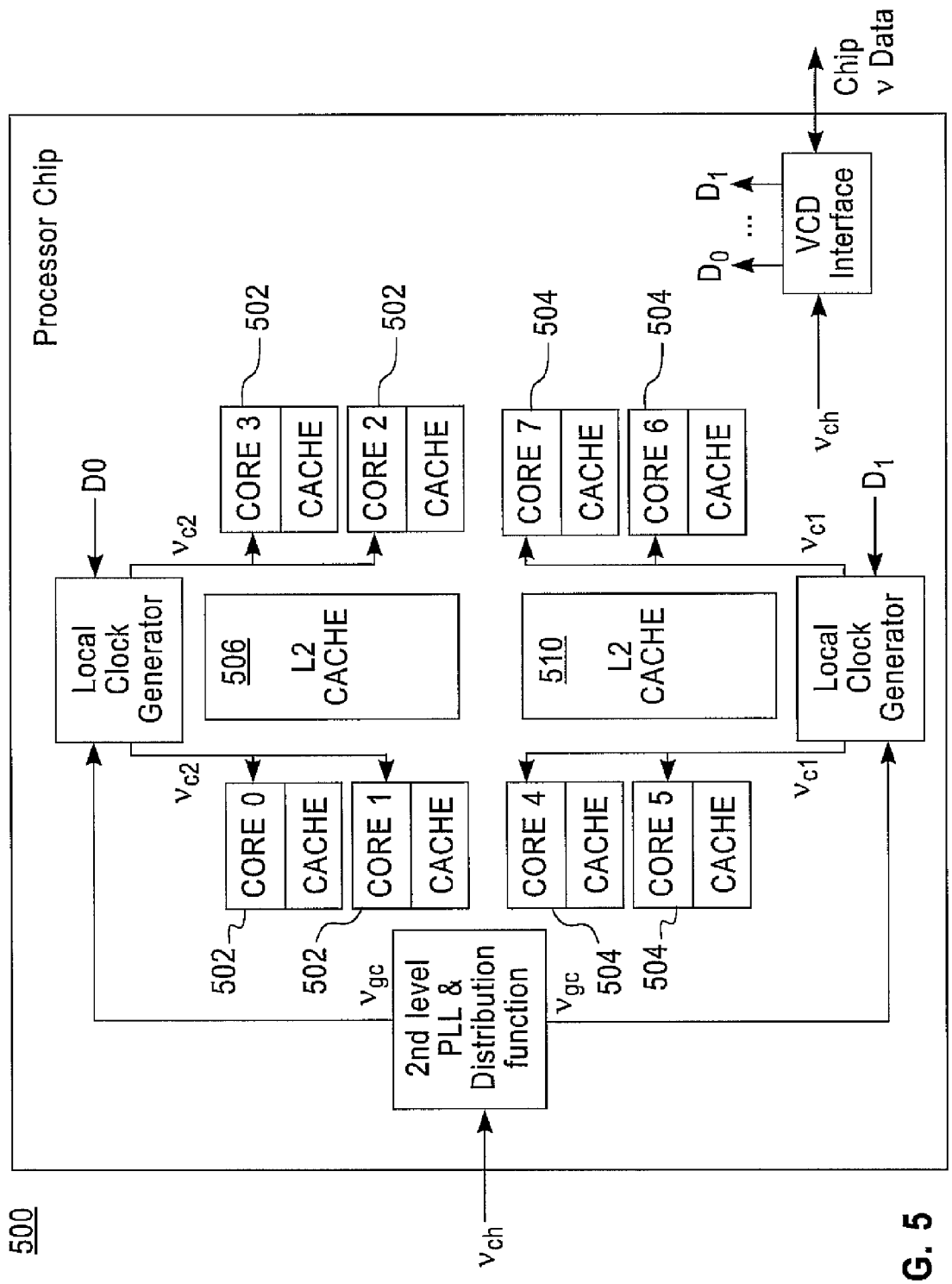
FIG. 5 illustrates a further alternate processor configuration in which multi-core groups share an L2 cache and a common local clock generator.

FIG. 5 illustrates at 500 another alternate processor chip configuration where multi-core groups 502, 504 share an L2 cache 506, 510 and a common local clock generator 512, 514. In this configuration, each core group of four contains one clock generator. FIG. 5 shows the core clock is multi-dropped to two cores but other interconnection topologies (e.g. star) can be used. The chip also contains the appropriate interfaces to the I/O, Memory, and Fabric controllers (not shown). The digital clocking attributes and functions discussed for FIG. 2 also apply to this configuration. This configuration has a common local frequency for a region of cores and the local shared cache. The granularity of clocking by core or core groups depends on the nature of technology variability, size of cores, etc.

The present invention enables a level of scalability and flexibility that is not readily available with today's state-of-the art. For example, with the present invention, the optimum core operation frequency can be determined by varying the local frequency and $V_{dd}$ (power supply voltage), and the invention enables in-field calibration of optimal operating conditions (if processor circuits degrade with time or environmental operating conditions).

The instant invention also enables redundant clocks—that is, each local clock generator could have a "Bypass" mode to allow a generic system clock or another core's clock to be used in the event that the local clock generator circuit fails (or shows low yield in early mfg.). With this invention, clock information is in digital format (data) at relatively low speed.

Different types of caches may be used in this invention. For instance, the invention may be used with a core cache (L1) synchronous with the core, but with a separate $V_{dd}$ from the core. The invention may also be used with a cache that is asynchronously shared among a set of processors; shown herein as running at a system frequency (ns), but the cache could also have a local, independent clock generator.

With this invention, different cores/regions/cache can have different $V_{dd}$ and different frequencies, and local clock grid(s) can be driven by, for example, a local clock source or a global chip clock grid driven by a global chip clock. The present invention allows global spread-spectrum from the system reference oscillator; each local clock generator may track the system reference oscillator spreading to avoid the "out-of-phase spreading" problem. In addition, with this invention, digital spread spectrum techniques via the DSP may also be used.

Aspects of the present invention can be embodied in a computer program product, which comprises all the respective features enabling the implementation of the methods described herein, and which—when loaded in a computer system—is able to carry out these methods. Computer program, software program, program, or software, in the present context mean any expression, in any language, code or notation, of a set of instructions intended to cause a system having an information processing capability to perform a particular function either directly or after either or both of the following: (a) conversion to another language, code or notation; and/or (b) reproduction in a different material form.

While it is apparent that the invention herein disclosed is well calculated to fulfill the objects stated above, it will be appreciated that numerous modifications and embodiments may be devised by those skilled in the art and it is intended that the appended claims cover all such modifications and embodiments as fall within the true spirit and scope of the present invention.

What is claimed is:

1. A method of frequency clocking in a processor chip, comprising the steps of:
   providing at least one processor chip having a plurality of processing cores, said at least one processor chip having a memory unit, and each of the processing cores having a respective clocking subsystem operating at a variable frequency;
   transmitting to said at least one processor chip:
   i) an analog signal at a given frequency, and
   ii) digital frequency control data for each of the clocking subsystems of the processing cores on the processor chip;
   said at least one processor chip:
   i) receiving said analog signal and said digital frequency control data, and
   ii) storing in the memory unit of the at least one processor chip, the digital frequency control data for the clocking subsystems of all of the cores on the processor chip, and
   iii) routing to each of the processing cores on said at least one processor chip, the digital frequency control data, including a desired frequency, for the clocking subsystem of said each of the processing cores; and
   each of the processing cores on the processor chip receiving the digital frequency control data transmitted to said each processing core from the processor chip including the desired frequency, using the desired frequency received from the processor chip to generate a ratio for converting the operating frequency of the clocking subsystem of said each of the processing cores to said desired frequency, and using said generated ratio to convert the operating frequency of the clocking subsystem of said each of the processing cores to the desired frequency.

2. A method according to claim 1, wherein said processor chip includes a chip distribution ASIC, and the transmitting step includes the steps of:
   transmitting an analog chip reference signal having a given frequency to the chip distribution ASIC; and
   said chip distribution ASIC:
   i) generating an output core generic analog signal, said core generic analog signal having a frequency greater than the frequency of the chip reference signal, and
   ii) transmitting said core generic analog signal to each of the processing cores.

3. A method according to claim 2, wherein said processor chip is on a processor module, and said processor module includes a module distribution ASIC, and the step of transmitting the analog chip reference signal includes the steps of:
   transmitting an analog primary reference signal having a defined frequency to said module distribution ASIC; and
   said module distribution ASIC:
   i) generating said analog chip reference signal, the frequency of the analog chip reference signal being greater than the frequency of the primary reference signal, and
   ii) transmitting the analog chip reference signal to the chip distribution ASIC.

4. A method according to claim 1, wherein:
   the transmitting step includes the steps of:
   i) transmitting an analog reference signal at the given frequency to a core distribution ASIC, and
   ii) said core distribution ASIC generating an output core generic signal, said core generic signal having a frequency greater than the frequency of the reference signal, and transmitting said core generic signal to each of the plurality of processing cores.

5. A method according to claim 4, wherein:
   the providing step includes the step of providing a further distribution ASIC; and
   the step of transmitting the analog reference signal to the core distribution ASIC includes the steps of
   i) transmitting an analog primary reference signal having a defined frequency to the further distribution ASIC, and
   ii) said further distribution ASIC generating an analog chip reference signal, the frequency of said analog chip reference signal being greater than the frequency of the analog primary reference signal, and transmitting the analog chip reference signal to the core distribution ASIC.

6. The method according to claim 1, wherein the using the desired frequency received from the processor chip to generate a ratio includes using the desired frequency and a given predetermined frequency for the clocking subsystem of said each of the processing cores to generate said ratio.

7. A system for frequency clocking in a processor chip having a plurality of processing cores, comprising:
each of the processing cores having a respective clocking subsystem operating at a variable frequency;
a digital transmission network for transmitting to the processor chip digital frequency control data for each of the clocking subsystems of the processing cores on the processor chip;
a memory unit on the processor chip for storing the digital frequency control data for the clocking subsystems of all of the processing cores on the processor chip;
an analog transmission network for transmitting to the processor chip an analog signal at a given frequency; and
wherein each of the clocking subsystem includes:
i) a receiver for receiving said analog signal and said digital frequency control data, and
the processor chip routes to each of the processing cores on the processor chip, the digital frequency control data, including a desired frequency, for the clocking subsystem of said each of the processing cores; and
each of the processing cores on the processor chip receiving the digital frequency control data transmitted to said each processing core from the processor chip including the desired frequency, using the desired frequency received from the processor chip to generate a ratio for converting the operating frequency of the clocking subsystem of said each of the processing cores to said desired frequency, and using said generated ratio to convert the operating frequency of the clocking subsystem of said each of the processing cores to the desired frequency.

8. A system according to claim 7, wherein the analog transmission network includes:
a chip distribution ASIC on the processor chip for receiving a chip reference analog signal having a given frequency, and for generating a core generic analog signal having a frequency greater than the frequency of the chip reference signal; and
a first connection for transmitting the core generic analog signal from the chip distribution ASIC to the plurality of processing cores.

9. A system according to claim 8, wherein said processor chip is on a processor module, and the analog transmission network further includes:
a module distribution ASIC on the processor module for receiving an analog module reference signal having a defined frequency, and for generating the chip reference signal, the frequency of the chip reference signal being greater than the frequency of the analog module reference signal; and
a second connection for transmitting the chip reference signal from the module distribution ASIC to the chip distribution ASIC.

10. A system according to claim 7, wherein each of the processing cores includes a respective one clocking system for generating an analog output clock signal at a variable frequency, and wherein:

the digital transmission network transmits digital frequency control data to said plurality of processing cores;
the analog transmission network transmits analog signals to said plurality of processing cores; and
each of the processing cores receives digital frequency control data and one of the analog signals and uses the received digital frequency control data and the received analog signal to set the frequency of the clocking system of said each of the processing cores.

11. A system according to claim 10, wherein:
the analog transmission network includes:
i) a first level distribution ASIC for receiving a reference analog signal having a given frequency, and for generating a chip analog signal having a frequency greater than the frequency of the reference analog signal, and
ii) a second level distribution ASIC for receiving the chip analog signal from the first level distribution ASIC, and for generating a generic core signal having a frequency greater than the frequency of the chip analog signal; and
each of the processing cores receives the generic core signal from the second level distribution ASIC.

12. A program storage device readable by machine, tangibly embodying a program of instructions executable by the machine to perform method steps for frequency clocking in a processor chip having a plurality of processing cores, said processor chip including a memory unit, and each of the processing cores having a respective clocking subsystem for generating an analog output clock signal at a variable frequency, said method steps comprising:
transmitting to said at least one processor chip:
i) an analog signal at a given frequency, and
ii) digital frequency control data for each of the processing cores on the processor chip; and
said at least one processor chip:
i) receiving said analog signal and said digital frequency control data, and
ii) storing in the memory unit of the at least one processor chip, the digital frequency control data for the clocking subsystems of all of the cores on the processor chip, and
iii) routing to each of the processing cores on said at least one processor chip, the digital frequency control data, including a desired frequency, for the clocking subsystem of said each of the processing cores; and
each of the processing cores on the processor chip receiving the digital frequency control data transmitted to said each processing core from the processor chip including the desired frequency, using the desired frequency received from the processor chip to generate a ratio for converting the operating frequency of the clocking subsystem of said each of the processing cores to said desired frequency, and using said generated ratio to convert the operating frequency of the clocking subsystem of said each of the processing cores to the desired frequency.

13. A program storage device according to claim 12, wherein said processor chip includes a chip distribution ASIC, and the transmitting step includes the steps of:
transmitting an analog chip reference signal having a given frequency to the chip distribution ASIC; and
said chip distribution ASIC:
i) generating an output core generic analog signal, said core generic analog signal having a frequency greater than the frequency of the chip reference signal, and
ii) transmitting said core generic analog signal to the plurality of processing cores.

14. A program storage device according to claim 13, wherein said processor chip is on a processor module, and said processor module includes a module distribution ASIC, and the step of transmitting the analog chip reference signal includes the steps of:

transmitting an analog primary reference signal having a defined frequency to said module distribution ASIC; and
said module distribution ASIC:
i) generating said analog chip reference signal, the frequency of the analog chip reference signal being greater than the frequency of the primary reference signal, and
ii) transmitting the analog chip reference signal to the chip distribution ASIC.

15. A program storage device according to claim 12, wherein:

the transmitting step includes the steps of:
i) transmitting an analog reference signal having a given frequency to a core distribution ASIC, and
ii) said core distribution ASIC generating an output core generic signal, said core generic signal having a frequency greater than the frequency of the reference signal, and transmitting said core generic signal to each of the plurality of processing cores.

16. A system for frequency clocking in a processor chip having a plurality of processing cores, each of said processing cores including a respective clocking subsystem operating at a variable frequency, the system comprising:

a digital transmission network for transmitting to the processor chip an associated digital frequency control value for each of the clocking subsystems of the processing cores on the processor chip;
a memory unit on the processor chip for storing the digital frequency control data for the clocking subsystems of all of the processing cores on the processor chip;
an analog transmission network for transmitting to each of the cores an associated analog signal;
and wherein:
the processor chip routes to each of the processing cores on the processor chip, the digital frequency control data, including a desired frequency, for the clocking subsystem of said each of the processing cores; and
each of the cores on the processor chip receives the digital frequency control data transmitted to said each processing core from the processor chip including the desired frequency, uses the desired frequency received from the processor chip to determine generate a ratio for converting the operating frequency of the clocking subsystem of said each of the processing cores to said desired frequency, and using said generated ratio to convert the operating frequency of the clocking subsystem of said each processing core to the desired frequency.

17. A system according to claim 16, wherein:

the analog transmission network includes:
i) a first level distribution ASIC for receiving a reference analog signal having a given frequency, and for generating a chip analog signal having a frequency greater than the frequency of the reference analog signal, and
ii) a second level distribution ASIC for receiving the chip analog signal from the first level distribution ASIC, and for generating a generic core signal having a frequency greater than the frequency of the chip analog signal; and
each of the processing cores receives the generic core signal from the second level distribution ASIC.

18. A system for frequency clocking in a processor chip having a plurality of processing cores, each of said processing cores including a clocking system for generating an analog clock signal at a variable frequency, the system comprising:

a digital transmission network for transmitting to each of the processing cores an associated digital value;
an analog transmission network for transmitted to each of the processing cores an associated analog signal; and
a memory unit for storing for each of the processor cores, a respective identification value and an associated optimal frequency value; and wherein:
each of the processing cores uses the digital value and the analog signal transmitted to the processing core to generate on the processing core an optimum processor clock frequency;
the digital transmission network transmits to each of the processing cores the optimal frequency value associated with said each of the processing cores;
each of the processing cores generate the optimum processor clock frequency for said each of the processing cores independently of the optimum processor clock frequencies generated by the others of the processing cores;
said optimal frequency values in the memory unit change over time; and
whenever the optimal frequency value associated with one of the processing cores changes, from an old value to a new value, the digital transmission network transmits said new value to said one of the processing cores.

19. A method of managing power applied to a processor chip having multiple processing cores, the processor chip having a memory unit, and each of the processing cores including a respective clocking subsystem operating at a variable frequency, the method comprising the steps of:

transmitting to the processor chip an analog signal and digital frequency control data for each of the clocking subsystems of the processing cores on the processor chip to set the frequencies of the clocking subsystems of the processing cores on the processor chip;
the processor chip
i) storing in the memory unit of the processor chip, the digital frequency control data for the clocking subsystems of all of the processing cores on the processor chip, and
ii) routing to each of the processing cores on said processor chip, the digital frequency control data, including a desired frequency, for the clocking subsystem of said each of the processing cores; and
each of the processing cores on the processor chip receiving the digital frequency control data transmitted to said each processing core from the processor chip including the desired frequency, using the desired frequency received from the processor chip to generate a ratio for converting the operating frequency of the clocking subsystem of said each of the processing cores to said desired frequency, and using said generated ratio to convert the operating frequency of the clocking subsystem of said each of the processing cores to the desired frequency;
switching off the clocking subsystems of selected ones of the processing cores at selected times to manage power-consumption by the processor chip.

20. A method according to claim 19, comprising the further step of applying a substantially constant power supply voltage to the processor chip during said switching step.

* * * * *